United States Patent [19]

Green et al.

[11] Patent Number: 4,851,895
[45] Date of Patent: Jul. 25, 1989

[54] METALLIZATION FOR INTEGRATED DEVICES

[75] Inventors: Martin L. Green, New Providence; Michal E. Gross, Summit, both of N.J.

[73] Assignee: American Telephone and Telegraph Company, AT&T Bell Laboratories, Murray Hill, N.J.

[21] Appl. No.: 59,210

[22] Filed: Jun. 3, 1987

Related U.S. Application Data

[63] Continuation of Ser. No. 731,100, May 6, 1985, abandoned.

[51] Int. Cl.⁴ ...................... H01L 23/48; H01L 29/46
[52] U.S. Cl. .......................... 357/67; 357/71; 427/126.5; 420/462
[58] Field of Search ................ 357/67, 71; 427/126.5; 420/462

[56] References Cited

U.S. PATENT DOCUMENTS

| | | | |
|---|---|---|---|
| Re. 28,820 | 5/1976 | Beer | 427/126.5 |
| 3,617,824 | 11/1971 | Shinoda | 357/67 S |
| 3,634,204 | 1/1972 | Dhaka | 357/67 |
| 3,657,029 | 4/1972 | Fuller | 156/11 |
| 3,755,107 | 8/1973 | Keith et al. | 427/126.5 |
| 3,881,884 | 5/1975 | Cook et al. | 29/590 |
| 4,017,890 | 4/1977 | Howard et al. | 357/67 |
| 4,039,698 | 8/1977 | Fraser et al. | 427/34 |
| 4,112,140 | 9/1978 | Heikel et al. | 427/126.5 |
| 4,166,880 | 9/1979 | Loferski et al. | 357/30 |

FOREIGN PATENT DOCUMENTS

| | | | |
|---|---|---|---|
| 0058464 | 5/1977 | Japan | 357/71 R |
| 0130446 | 10/1981 | Japan | 420/462 |

OTHER PUBLICATIONS

CRC Handbook of Chem. and Phys., 57th Ed., 1976–1977, p. B–153, Cleveland, OH.
Murarka, J. Vac. Sci. Technol., 17(4), Jul./Aug. 1980, "Refractory Silicides for Integrated Circuits", pp. 775–792.
IBM Technical Disclosure Bulletin, "Transition Metal Oxide Conductors in Integrated Circuits", vol. 20, Apr. 1978, by J. A. Armstrong et al., p. 4633.

Primary Examiner—Andrew J. James
Assistant Examiner—Jerome Jackson, Jr.
Attorney, Agent, or Firm—Peter A. Businger

[57] ABSTRACT

Metallization of integrated devices using ruthenium as a metallization material results in well-adhering contacts to source and drain regions as well as to gate oxide. Ruthenium is similarly suited as a diffusion barrier metallization between, e.g., silicon and aluminum and as an interconnection metallization material. And, as a diffusion barrier material, ruthenium dioxide may be used.

1 Claim, 1 Drawing Sheet

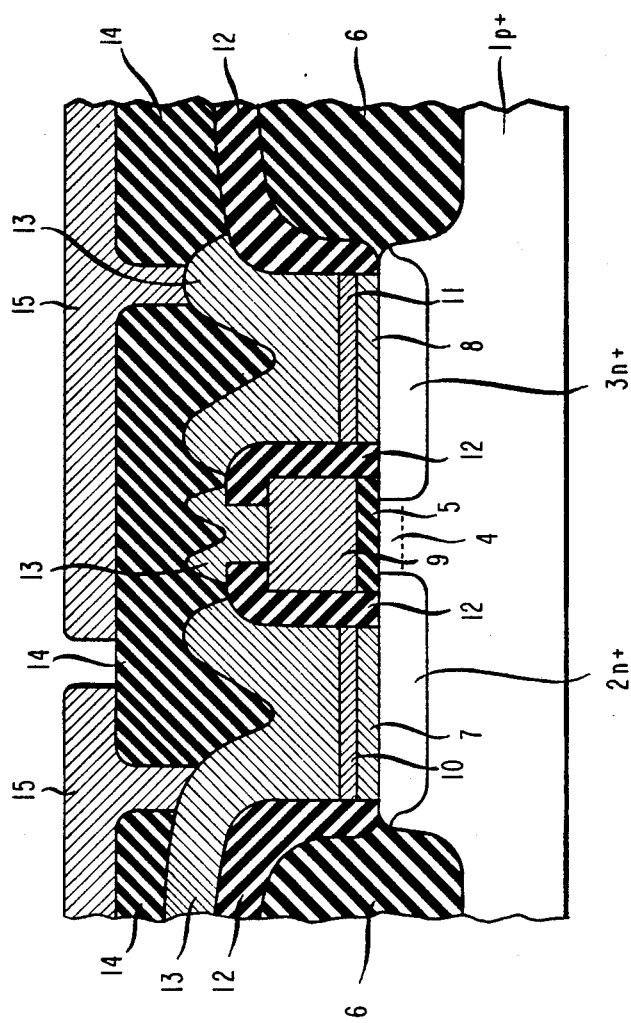

METALLIZATION FOR INTEGRATED DEVICES

This application is a continuation of application Ser. No. 731,100 filed May 6, 1985, now abandoned.

TECHNICAL FIELD

The invention is concerned with electrical contacts and conductors and their manufacture in integrated device technology.

BACKGROUND OF THE INVENTION

Integrated device technology depends heavily on the use of metallization layers and the patterning of such layers on semiconducting and insulating materials. Typically, such materials are doped or undoped silicon, gallium arsenide, other binary, ternary, or quaternary III-V, or II-VI semiconductor materials, or insulating materials such as, e.g., silica, alumina, and polymeric layers.

The suitability of a material as a metallization material depends on a number of materials properties such as, e.g., electrical conductivity, electrical contact resistance, stability of such electrical properties over time, physical integrity and adhesion, and the availability of a suitable etchant in photolithographic processing. Among such metallization materials are gold, aluminum, alloys of aluminum and copper, and composite or multi-layer systems; see, e.g., documents as discussed below for specific materials and their processing.

U.S. Pat. No. 3,657,029, issued Apr. 18, 1972 to C. R. Fuller is concerned with a multi-layer metallization method in which a layer of platinum, palladium, rhodium, ruthenium, osmium, or iridium is etched using chromium or titanium as a mask material.

U.S. Pat. No. 3,881,884, issued May 6, 1975 to H. C. Cook et al. discloses the manufacture of a composite conductive layer comprising an exposed layer of gold, platinum, palladium, iridium, rhodium, ruthenium, or osmium.

U.S. Pat. No. 4,017,890, issued Apr. 12, 1977 to J. K. Howard et al. discloses the use of an intermetallic compound of aluminum and a transition metal such as palladium, platinum, chromium, hafnium, zirconium, antimony, titanium, tungsten, vanadium, tantalum, cobalt, or nickel as a semiconductor metallization.

U.S. Pat. No. 4,039,698, issued Aug. 2, 1977 to D. B. Fraser et al. discloses platinum metallizations and is particularly concerned with a method for making such metallizations.

The paper by J. A. Armstrong et al., "Transition Metal Oxide Conductors in Integrated Circuits", IBM Technical Disclosure Bulletin, Volume 20, No. 11A, April 1978 discloses the suitability of certain metal oxides such as molybdenum, ruthenium, rhodium, osmium, iridium, and platinum oxides as metallization materials, such materials having resistivities which are only about 5 to 25 times those of copper, molybdenum, gold, and an aluminum-copper-silicon alloy.

SUMMARY OF THE INVENTION

Integrated device metallizations are produced from a ruthenium material. More specifically, an integrated device comprises a conductive region in which conduction is essentially confined, for some distance, to a material which consists of at least 40 atom percent ruthenium. Such material can be used as gate metallization, source metallization, drain metallization, as a diffusion barrier, and as an interconnect metallization. A particular advantage arises from the fact that electrical conductivity of a layer remains high when ruthenium is oxidized to ruthenium dioxide, and such oxidation may indeed be intentional in view of particular suitability of ruthenium dioxide as a diffusion barrier material.

BRIEF DESCRIPTION OF THE DRAWING

The Figure shows in schematic cross section an integrated semiconductor device comprising metallizations for source, drain, and gate contacts, for a barrier layer, and for interconnect metallizations.

DETAILED DESCRIPTION

The Figure schematically shows a cross-section of an n-channel metal-oxide semiconductor device comprising a body of silicon 1 which is doped p-plus except for a source region 2 and a drain region 3 which are doped n-plus. A channel region 4 is covered with a gate oxide layer 5, and field oxide regions 6 adjoin the source region 2 and the drain region 3. A contact metallization layer 7 is on the source region 2, a contact metallization layer 8 is on the drain region 3, and a gate metallization layer 9 is n the gate oxide layer 5. Diffusion barrier metallization layers 10 and 11 are on the contact metallization layers 7 and 8, respectively, a first insulating oxide layer 12 insulates the field oxide regions 6 as well as the gate metallization layer 9, and a first interconnect metallization 13 is shown in contact with the diffusion barrier metallization layers 10 and 11 and with the gate metallization layer 9. A second insulating oxide layer 14 is on the interconnect metallization layer 13, and a second interconnect metallization layer 15 on the second insulating oxide layer 14 is in contact with the first interconnect metallization layer 13 by means of so-called via holes in the second insulating oxide layer 14.

In accordance with the invention a metallization such as, e.g., source contact metallization 7, drain contact metallization 8, gate metallization 9, diffusion barrier layers 10 and 11, interconnect metallization layer 13, or interconnect metallization layer 15 is made as a layer which consists of a ruthenium material which preferably comprises at least 40 atom percent ruthenium. Among typical material impurities are carbon, preferably in an amount of less than 20 atom percent of the material, and oxygen, preferably in an amount of less than 60 atom percent of the material. Also among potentially present impurities are other platinum group elements as well as argon.

Typical layer thicknesses are approximately 1000 Angstroms for a diffusion barrier layer, approximately 2500 Angstroms for a gate metallization layer, and less than approximately 1 micrometer for an interconnect metallization layer.

In accordance with the invention, ruthenium is considered as particularly suitable as a metallization material in view of its high melting temperature, a property which facilitates subsequent processing at elevated temperature. Furthermore, ruthenium has good adhesion and low contact resistance to silicon and also to other metallization mateirals such as, e.g., aluminum; such properties make ruthenium particularly suitable as a contact material. Moreover, on account of its high conductivity and electromigration resistance, ruthenium can serve as an interconnection material and, on account of its high stability relative to silicon and aluminum, ruthenium is suitable as a diffusion barrier material. In this latter application, ruthenium was found to be superior to currently used tungsten.

Deposition of ruthenium metallization layers is preferably carried out by so-called chemical vapor deposition, and organometallic precursor compounds are preferred in such deposition. While alternate deposition methods such as, e.g., evaporation, sputtering, and electrodeposition are not precluded, use of chemical vapor deposition is considered as particularly advantageous, e.g., in view of superior step coverage of a deposited layer. This aspect is of particular importance in the case of interconnect metallization layers.

Patterning of a deposited layer typically is by photolithographic processing and preferably involves dryetching by means of a fluorine-based dry etchant compound. Such choice of etchant is advantageous, e.g., in view of high volatility of reaction products, obviating the need for high-temperature processing.

An additional benefit from the use of ruthenium as a metallization material derives from the fact that ruthenium dioxide has metallic conductivity. Accordingly, no special measures are required to prevent the almost inevitable, unintentional oxidation during processing. (A nonconducting RuO phase is thermodynamically stable only at low temperatures and, if present, is preferably limited so that less than 25 atom percent ruthenium is included in this form).

Furthermore, oxidation of ruthenium so as to result in the formation of ruthenium dioxide may in fact be intentional on account of a particular suitability of ruthenium dioxide as a diffusion barrier material. This is borne out by Rutherford back-scattering analysis carried out on multilayer structures of ruthenium dioxide between layers of aluminum and silicon and, for the sake of comparison, of tungsten between aluminum and silicon. While the latter structure exhibited a considerable amount of interdiffusion of aluminum, silicon, and tungsten at temperatures as low as 500 degrees C., the former proved to be not subject to interdiffusion even at temperatures as high as 600 to 650 degrees C.

In this case, i.e. when a diffusion barrier is made of ruthenium dioxide, deviation from stoichiometry preferably is limited such that the number of oxygen atoms per atom of ruthenium present in the material is in a preferred range of from 1.8 to 2.2.

Specific examples as given below involved film deposition using standard chemical vapor deposition apparatus. To prevent condensation of the sublimable source mateials, all surfaces of the apparatus outside the reaction zone were maintained at temperatures greater than the source sublimation temperature and lower than its decomposition temperature. And, for the sake of minimization of condensation, the source boat was placed close to the substrates.

EXAMPLE 1

Substrates of (100) silicon were cleaned in one-percent hydrofluoric acid for 1 minute, rinsed in distilled water for 10 minutes, and dried in a stream of nitrogen. The cleaned substrates were loaded onto a quartz carrier and positioned vertically in the reaction furnace which was at a temperature of approximately 200 degrees C. The deposition apparatus was evacuated to a pressure of approximately 20 millitorr and heated to a deposition temperature of approximately 300 degrees C. while pumping continued. Ruthenium source material, triruthenium dodecacarbonyl, was heated until sublimation was observed. During deposition, chamber pressure as monitored with a capacitance manometer stayed below 0.1 torr.

After deposition, the apparatus was cooled to a temperature of approximately 200 degrees C. and the substrates were removed. The thickness of the deposited film was measured with a mechanical stylus on steps etched with an aqueous solution containing 5 percent NaOCl and 3 percent NaOH; the measured thickness was 1029 Angstroms. Electrical sheet resistance of the deposited film had measured with a four-point probe, and a value of approximately 17 micro-ohm-cm was determined as the resistivity of the deposited film. The deposited film was a metallic appearance, and film adhesion was excellent. Grain size was approximately 300 Angstroms, and texture was (100). X-ray diffraction showed the material to be predominantly ruthenium.

EXAMPLE 2

Cleaned substrates as described in Example 1 above were loaded onto a quartz carrier and positioned vertically in the deposition apparatus which was at a temperature of approximately 200 degrees C. The apparatus was evacuated to a pressure of approximately 20 millitorr and heated to a deposition temperature of approximately 600 degrees C. while pumping continued. Once the temperature had stabilized, a flow of oxygen was started and the ruthenium source material, ruthenium acetylacetonate, was heated to sublimation temperature. Monitored deposition pressure stayed below 1 torr. Measured thickness of the depositied film was 1449 Angstroms, and resistivity was determined to be approximately 650 micro-ohm-cm. The appearance of the film was metallic, purple-blue, and film adhesion was excellent. Grain size was in the range of from 100 to 500 Angstroms, and texture was essentially random. The material was predominantly ruthenium dioxide.

EXAMPLE 3

Processing was as described in Example 2 above except that a flow of hydrogen was used instead of the oxygen. Measured film thickness was 854 Angstroms, resistivity was approximately 520 micro-ohm-cm, the film appeared dark and metallic and had excellent adhesion, grain size was in the range of from 300 to 1000 Angstroms, and texture was essentially (002) of ruthenium phase; the material was a mixture of ruthenium and ruthenium dioxide.

EXAMPLE 4

Processing was as described as in Example 2 above except that ruthenocene was used as the ruthenium source material, deposition temperature was approximately 575 degrees C., and deposition pressure stayed below 5 torr. Measured film thickness was approximately 6100 Angstoms, resistivity was approximately 90 micro-ohm-cm, the film appeared blue and had excellent adhesion, grain size was approximately 5000 Angstroms, and texture was random. The material was predominantly ruthenium dioxide.

EXAMPLE 5

A silicon substrate bearing a layer of thermal oxide (silicon dioxide) having a thickness of approximately 1000 Angstroms was processed as described in Example 2 above. Thickness of the deposited film was 707 Angstroms, resistivity was approximately 15 micro-ohm-cm, the film appeared metallic and dark, adhesion was excellent, grain size was in the range of from 500 to 750

Angstroms, and texture was predominantly (200), (111) of ruthenium dioxide; the material was a mixture of ruthenium and ruthenium dioxide.

What is claimed is:

1. An integrated device comprising a body of semiconductor material and a diffusion barrier element, said diffusion barrier element being between a first metal element and a second metal element, the material of said diffusion barrier element consisting essentially of ruthenium dioxide.

* * * * *